(12) United States Patent
Yang et al.

(10) Patent No.: US 11,588,024 B2
(45) Date of Patent: Feb. 21, 2023

(54) HIGH VOLTAGE BLOCKING III-V SEMICONDUCTOR DEVICE

(71) Applicant: Infineon Technologies Austria AG, Villach (AT)

(72) Inventors: Shu Yang, Cambridge (GB); Giorgia Longobardi, Cambridge (GB); Florin Udrea, Cambridge (GB); Dario Pagnano, Cambridge (GB); Gianluca Camuso, Cambridge (GB); Jinming Sun, Irvine, CA (US); Mohamed Imam, Chandler, AZ (US); Alain Charles, Redondo Beach, CA (US)

(73) Assignee: Infineon Technologies Austria AG, Villach (AT)

(*) Notice: Subject to any disclaimer, the term of this patent is extended or adjusted under 35 U.S.C. 154(b) by 70 days.

(21) Appl. No.: 15/462,019

(22) Filed: Mar. 17, 2017

(65) Prior Publication Data

US 2018/0269282 A1  Sep. 20, 2018

(51) Int. Cl.
*H01L 29/778* (2006.01)
*H01L 29/36* (2006.01)
(Continued)

(52) U.S. Cl.
CPC .......... *H01L 29/36* (2013.01); *H01L 29/0603* (2013.01); *H01L 29/41766* (2013.01);
(Continued)

(58) Field of Classification Search
CPC ............. H01L 29/2003; H01L 29/0603; H01L 29/0638; H01L 29/205; H01L 29/36;
(Continued)

(56) References Cited

U.S. PATENT DOCUMENTS

| 6,703,684 B2 | 3/2004 | Urdea et al. |
| 2012/0153355 A1* | 6/2012 | Umeda ............... H01L 29/2003 257/192 |
| 2017/0033210 A1 | 2/2017 | Curatola et al. |

OTHER PUBLICATIONS

Curatola, Gilberto, "High Electron Mobility Transistor with Graded Back-Barrier Region", U.S. Appl. No. 15/352,115, filed Nov. 15, 2016, pp. 1-26.

(Continued)

*Primary Examiner* — Meiya Li
(74) *Attorney, Agent, or Firm* — Murphy, Bilak & Homiller, PLLC

(57) ABSTRACT

A semiconductor device includes a type IV semiconductor base substrate, a first type III-V semiconductor layer formed on a first surface of the base substrate, and a second type III-V semiconductor layer with a different bandgap as the first type III-V being formed on the first type III-V semiconductor layer. The semiconductor device further includes first and second electrically conductive device terminals each being formed on the second type III-V semiconductor layer and each being in ohmic contact with the two-dimensional charge carrier gas. The base substrate includes a first highly doped island that is disposed directly beneath the second device terminal and extends to the first surface of the base substrate. The first highly-doped island is laterally disposed between portions of semiconductor material having a lower net doping concentration than the first highly-doped island.

16 Claims, 5 Drawing Sheets

(51) Int. Cl.
*H01L 29/417* (2006.01)
*H01L 29/06* (2006.01)
*H01L 29/861* (2006.01)
*H01L 29/20* (2006.01)

(52) U.S. Cl.
CPC ........ *H01L 29/7786* (2013.01); *H01L 29/861* (2013.01); *H01L 29/2003* (2013.01)

(58) Field of Classification Search
CPC ........... H01L 29/41766; H01L 29/7786; H01L 29/7787; H01L 29/861; H01L 29/8618
See application file for complete search history.

(56) References Cited

OTHER PUBLICATIONS

Lu, B et al., "High breakdown (>1500) AlGaN/GaN HEMTs by Substrate-Transfer Technology", MIT Open Access Articles, IEEE Electron Device Letter, vol. 31, No. 9, Sep. 2010, pp. 951-953.
Srivastava, P et al., "Record Breakdown Voltage (2200 V) of GaN DHFETs on Si with 2micrometer Buffer Thickness by Local Substrate Removal", IEEEE Electron Device Letters, vol. 32, No. 1, Jan. 2011, pp. 30-32.
Umeda, Hidekazu et al., "Blocking-Voltage Boosting Technology for GaN Transistors by Widening Depletion Layer in Si Substrates", Electron Devices Meeting (IEDM), 2010 IEEE International, Jan. 28, 2011, pp. 1-4.
Yang, et al., "GaN-toSi vertical conduction mechanisms in AlGaN/GaN-on-Si lateral heterojunction FET structures", Physica Status Solidi C, vol. 11, No. 3-4, 2014, pp. 949-952.

\* cited by examiner

HIGH VOLTAGE BLOCKING III-V SEMICONDUCTOR DEVICE

TECHNICAL FIELD

The instant application relates to semiconductor devices, and in particular relates to high-electron-mobility devices with high voltage ratings.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN.

HEMTs are commonly formed from III-V semiconductor materials, such as GaN, GaAs, InGaN, AlGaN, etc. In a GaN/AlGaN based HEMT, a two-dimensional electron gas (2DEG) arises at the interface between the AlGaN barrier layer and the GaN buffer layer. The 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

One technique for forming III-V semiconductors for HEMTs involves using a readily available semiconductor wafer, such as a Silicon wafer, to grow III-V semiconductor material thereon. This technique is preferable at least in part because of the abundance and availability of type IV semiconductor wafers, such as Silicon wafers. Direct epitaxial growth of III-V semiconductor material on a type IV semiconductor wafer is not possible. For this reason, the surface of the Silicon wafer is coated with a nucleation layer (e.g., an AlN layer), which enables the growth of III-V semiconductor material thereon. A lattice transition layer can be formed on the nucleation layer to alleviate mechanical stress from lattice mismatch between the crystalline structure of the wafer and the III-V semiconductor epitaxial layers.

One performance limitation of modern semiconductor devices that designers seek to mitigate is leakage current. In general, leakage current refers to undesirable electrical conduction between two terminals in a device that are nominally electrically isolated from one another. For instance, any current that flows between the source and drain terminals of a transistor in the "OFF" state is considered leakage current, which can detrimentally impact power dissipation and limit the voltage blocking capability of the device.

HEMTs that utilize a type IV semiconductor wafer as a base substrate are susceptible to vertical leakage whereby the base substrate provides a leakage path between the source and drain terminals of the device. Phenomena such as tunneling, thermionic emission and electron injection allows electrons to traverse the interface between the type IV semiconductor substrate and the type III-V semiconductor material. At sufficiently high voltages, this current flow predominates and limits the voltage blocking capability of the device.

SUMMARY

A semiconductor device is disclosed. According to an embodiment, the semiconductor device includes a type IV semiconductor base substrate, a first type III-V semiconductor layer formed on a first surface of the base substrate, and a second type III-V semiconductor layer formed on the first type III-V semiconductor layer. The second type III-V semiconductor layer has a different bandgap as the first type III-V semiconductor layer such that a two-dimensional charge carrier gas forms at an interface between the first and second type III-V semiconductor layers. The semiconductor device further includes first and second electrically conductive device terminals each being formed on the second type III-V semiconductor layer and each being in ohmic contact with the two-dimensional charge carrier gas. The base substrate includes a first highly doped island that is disposed directly beneath the second device terminal and extends to the first surface of the base substrate. The first highly-doped island is laterally disposed between portions of semiconductor material having a lower net doping concentration than the first highly-doped island.

According to another embodiment, the semiconductor device includes a type IV semiconductor base substrate having a highly-doped island that extends to a first surface of the substrate and is laterally disposed between portions of semiconductor material having a lower net doping concentration than the first highly-doped island. The semiconductor device further includes a first type III-V semiconductor layer formed on a first surface of the base substrate, and a second type III-V semiconductor layer formed on the first type III-V semiconductor layer. The second type III-V semiconductor layer has a different bandgap as the first type III-V semiconductor layer such that a two-dimensional charge carrier gas forms at an interface between the first and second type III-V semiconductor layers. The semiconductor device further includes first and second electrically conductive device terminals each being formed on the second type III-V semiconductor layer and each being in ohmic contact with the two-dimensional charge carrier gas. The semiconductor device is configured to block a conductive connection between the first and second device terminals during a blocking state. A depletion region forms across the first highly-doped island during the blocking state. The highly-doped island is configured to suppress electron generation in the depletion region from impact ionization in the base substrate during the blocking state.

According to another embodiment, the semiconductor device includes a base substrate having a lower region of type IV semiconductor material extending to a rear surface of the base substrate, a dielectric layer formed directly on the lower region of type IV semiconductor material, and a highly-doped layer of type IV semiconductor material formed directly on the dielectric layer. The highly-doped layer has a doping concentration that is at least two orders of magnitude greater than a doping concentration of the lower region of type IV semiconductor material. The semiconductor device further includes a first type III-V semiconductor layer disposed on the base substrate, and a second type III-V semiconductor layer formed on the first type III-V semiconductor layer. The second type III-V semiconductor layer has a different bandgap as the first type III-V semiconductor layer such that a two-dimensional charge carrier gas forms at an interface between the first and second type III-V semiconductor layers. The semiconductor device further includes first and second electrically conductive device terminals each being formed on the second type III-V semiconductor layer and each being in ohmic contact with the two-dimensional charge carrier gas.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a semiconductor device having a type IV semiconductor base substrate and type III-V semiconductor layers formed thereon. A high-electron-mobility semiconductor device (e.g., an HEMT or diode) is formed in the type III-V semiconductor layers. The base substrate includes structures that mitigate vertical leakage in the voltage blocking state of the high-electron-mobility semiconductor device.

The inventors have extensively studied the mechanisms responsible for vertical leakage in semiconductor devices that include a type III-V semiconductor heterojunction device formed on a type IV semiconductor base substrate. One component of vertical leakage is so-called energy barrier limited current, which refers to the current associated with electrons traversing the energy barrier between the type IV semiconductor base substrate and the type III-V semiconductor material disposed thereon. When this energy barrier is relatively large, the leakage currents are low and the energy barrier limited current is the dominant component of the vertical leakage current. Another component of vertical leakage is so-called space-charge limited current.

Space-charge limited current refers to electron generation that arises in a space charge region beneath the blocking terminal (e.g., the drain terminal) during a high voltage blocking state of the device. When the energy barrier is relatively small and the leakage currents are high, space-charge-limited current is the dominant component of the vertical leakage of the device.

A semiconductor device according to embodiments described herein includes an impact ionization mitigation structure. The impact ionization mitigation structure is disposed directly beneath the drain terminal of the device at the interface between the base substrate and the III-V semiconductor material. According to one embodiment, the impact ionization mitigation structure is configured as a highly-doped island (e.g., a P++ region) in the base substrate. The highly-doped island includes a high concentration of acceptors that serve to suppress electron generation via impact ionization in the space charge region that arises during a voltage blocking state of the device. As a result, electron injection from the base substrate into the III-V semiconductor material during the voltage blocking state of the device is substantially reduced and hence the vertical leakage current of the device is substantially reduced.

Figure 1:
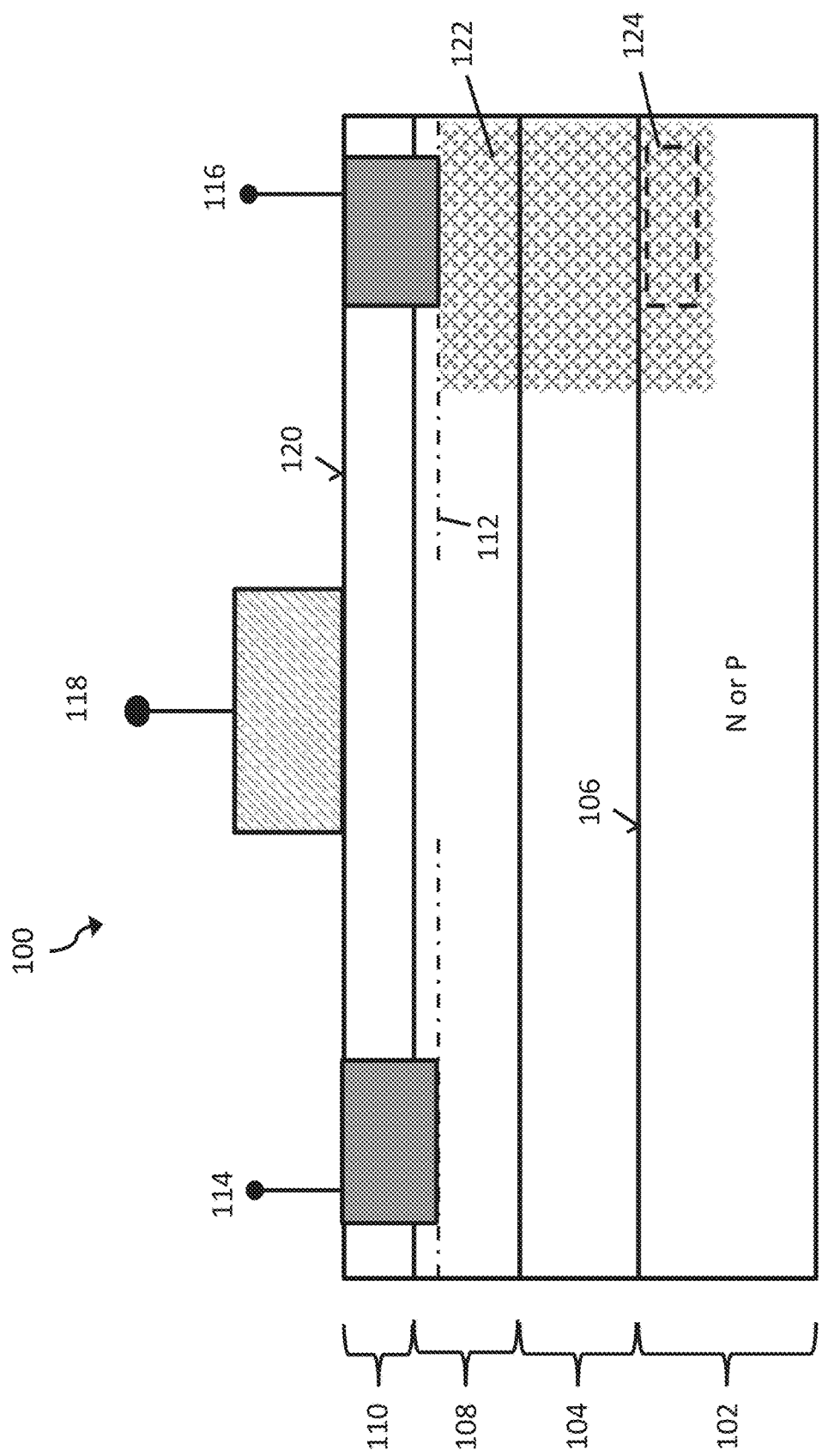
FIG. 1 illustrates a semiconductor device with an impact ionization mitigation structure disposed in a depletion region that extends into the base substrate during a blocking state of the device, according to an embodiment.

Referring to FIG. 1, a semiconductor device 100 is depicted, according to an embodiment. The semiconductor device 100 includes a base substrate 102. The base substrate 102 can include any semiconductor material suitable for the epitaxial growth of a type III-V semiconductor layer thereon. Exemplary materials for the base substrate 102 include group IV semiconductor materials such as Silicon (Si), and compound group IV semiconductor materials such as Silicon carbide (SiC) or Silicon germanium (SiGe).

According to an embodiment, the base substrate 102 is provided from a commercially available bulk Silicon wafer. The bulk Silicon wafer can have an intrinsic net doping type of a first conductivity type (e.g., n-type) or a second conductivity type (e.g., p-type). The intrinsic doping concentration of the base substrate 102 can vary from lightly doped to heavily doped, e.g., between $10^{14}$ dopant atoms/cm$^3$ to $10^{19}$ dopant atoms/cm$^3$. According to one embodiment, the intrinsic doping concentration of the base substrate 102 is in the range of $1 \times 10^{15}$-$1 \times 10^{16}$ dopant atoms/cm$^3$.

The semiconductor device 100 further includes a transition region 104 formed on a first surface 106 of the base substrate 102. The transition region 104 is configured to, among other things, facilitate epitaxial growth of high quality III-V semiconductor crystalline material thereon, and to alleviate stress between the base substrate 102 and III-V semiconductors formed on the transition region 104. The transition region 104 may include at least one relatively thin (e.g., ≤300 nm) nucleation layer that is formed directly on the first surface 106 of the base substrate 102. This nucleation layer may be a layer of Aluminum Nitride (AlN), for example. Alternatively, the nucleation layer can be a compound semiconductor layer having multiple semiconductor layers of different composition. For example, the nucleation layer may include two or more nitride layers that are separated from one another by another by a doped type III-V semiconductor nitride layer.

The transition region 104 may additionally include one or more lattice transition layers. The lattice transition layers are configured to alleviate stress between the base substrate 102 and III-V semiconductor layers formed on the transition region 104 that is attributable to crystalline lattice mismatch. The lattice transition layers may include one or more metal semiconductor nitride (e.g., AlGaN) layers with a gradually diminishing metallic content with increasing separation distance from the base substrate 102. According to another embodiment, the lattice transition layers are provided by multiple nitride layers (e.g., AlN) periodically interposed between multiple type III-V semiconductor layers (e.g. GaN).

The semiconductor device 100 further includes first and second type III-V semiconductor layers 108, 110. The first type III-V semiconductor layer 108 can be formed directly or indirectly on the transition region 104, and the second type III-V semiconductor layer 110 can be formed directly or indirectly on the first type III-V semiconductor layer 108. The second type III-V semiconductor layer 110 is formed from a semiconductor material having a different band gap than the first type III-V semiconductor layer 108. Due to this difference in band gap, a two-dimensional charge carrier gas channel 112 arises near an interface between the first type III-V semiconductor layer 108 and the second type III-V semiconductor layer 110 due to polarization effects. Thus, the first type III-V semiconductor layer 108 forms a so-called buffer layer and the second type III-V semiconductor layer 110 forms a so-called barrier layer of the semiconductor device 100.

According to an embodiment, the first type III-V semiconductor layer 108 includes gallium nitride (GaN) and the second type III-V semiconductor layer 110 includes aluminum gallium nitride (AlGaN). The first type III-V semiconductor layer 108 can be an intrinsic layer of pure or essentially pure GaN. Alternatively, the first type III-V semiconductor layer 108 can include AlGaN with a very low Al content (e.g., ≤10%) and, in addition or in the alternative, may include dopant atoms such as (e.g., carbon or iron). Both of the first and second type III-V semiconductor layers 108, 110 can be formed by epitaxial growth techniques, for example.

The semiconductor device 100 further includes first and second electrically conductive device terminals 114, 116 that are formed on the second type III-V semiconductor layer 110. The first and second electrically conductive device terminals 114, 116 can be formed from conductive metals, such as tungsten or aluminum, or alternatively can be formed from highly-doped monocrystalline or polycrystalline semiconductors. The first and second device terminals 114, 116 are each in ohmic contact with the two-dimensional charge carrier gas channel 112. In a forward conducting state of the device, the first and second device terminals 114, 116 are conductively connected to one another via the two-dimensional charge carrier gas channel 112. In a blocking state of the device, the conductive connection between the first and second device terminals 114, 116 is interrupted and a voltage develops across the first and second device terminals 114, 116.

According to an embodiment, the semiconductor device 100 is configured as a heterostructure field effect transistor (HEMT), wherein the first and second device terminals 114, 116 provide the source and drain terminals of the device, respectively. In this embodiment, the device is configured to control a conduction state of the two-dimensional charge carrier gas channel 112 responsive to a control signal. To this end, the device includes a gate structure 118 that is disposed over the two-dimensional charge carrier gas channel 112 and is configured to control the conductive connection between the first and second device terminals 114, 116. This gate structure 118 can be configured to alter the intrinsic "normally-on" configuration of the device into a "normally-off" configuration. For example, the gate structure 118 may include a doped region (e.g., p-type GaN) that depletes the two-dimensional charge carrier gas channel 112 in the absence of a gate bias and results in a "normally-off" device configuration. Alternatively, the gate structure 118 may be provided in a recessed portion of the second type III-V semiconductor layer 110 that locally disrupts the two-dimensional charge carrier gas channel 112 to provide a "normally-off" device configuration.

The high electron mobility semiconductor device 100 shown in FIG. 1 is configured as a lateral device. That is, the conductive channel portion extends in a lateral direction that is parallel to the main surface 120 of the device 100. Alternatively, the high electron mobility semiconductor device 100 may be configured as a vertical or quasi-vertical device such that at least a portion of the conductive channel extends in a vertical direction that is perpendicular to the main surface 120.

According to another embodiment, the semiconductor device 100 is configured as a diode. In this embodiment, the second device terminal 116 provides the cathode of the diode. The anode of the diode can be provided by electrically connecting the first device terminal 114 with the gate structure 118 (or a similar structure that is configured to complete the conductive connection between the first and second devices terminals 114, 116). When the first device terminal 114 and the gate structure 118 are forward biased, a conductive connection between the first and second device terminals 114, 116 is completed and the diode is operating in forward conducting mode. When this forward bias is removed, the diode is in a blocking mode. This represents just one example of a variety of diode configurations that utilize the type III-V semiconductor device concept.

In the depicted embodiment, a depletion region 122 (i.e. a space charge region) is shown. This depletion region 122 develops when the device is in an OFF or blocking state (i.e., when a conductive connection between the first and second device terminals 114, 116 is nominally blocked). At very high blocking voltages wherein a voltage at the second device terminal 116 is much greater (e.g., 100 V or more) than a voltage at the first device terminal 114, the depletion region 122 extends mainly directly beneath the second device terminal 116 and into the base substrate 102 in the depicted manner. In this state, vertical leakage via space charge limited current becomes an issue. Vertical leakage occurs when carriers (e.g., electrons) are injected from the base substrate 102 into the adjoining III-V semiconductor regions. The voltage rating of the device 100 (i.e., the highest voltage at which the device 100 can remain in a blocking state) is limited by this leakage current. At very high blocking voltages, impact ionization in the depletion region 122 is the dominant source of carrier injection that contributes to vertical leakage.

Each of the embodiments described herein include an impact ionization mitigation structure 124 that is disposed in the depletion region 122 at the interface between the base substrate 102 and the adjoining type III-V semiconductor material (i.e., the interface between the base substrate 102 and the transition region 104 in the depicted example). The impact ionization mitigation structure 124 is configured to prevent the generation of free electrons in this region. As a result, carrier injection across the barrier between the base substrate 102 and the nitride based layer on top of the semiconductor substrate (via thermionic emission or tunneling) is substantially reduced. Various embodiments of the impact ionization mitigation structure 124 will now be described with reference to FIGS. 2-5. In each case, any one of the various features of the semiconductor device 100 described with reference to FIG. 1 may be combined with the impact ionization mitigation structure 124.

Figure 2:
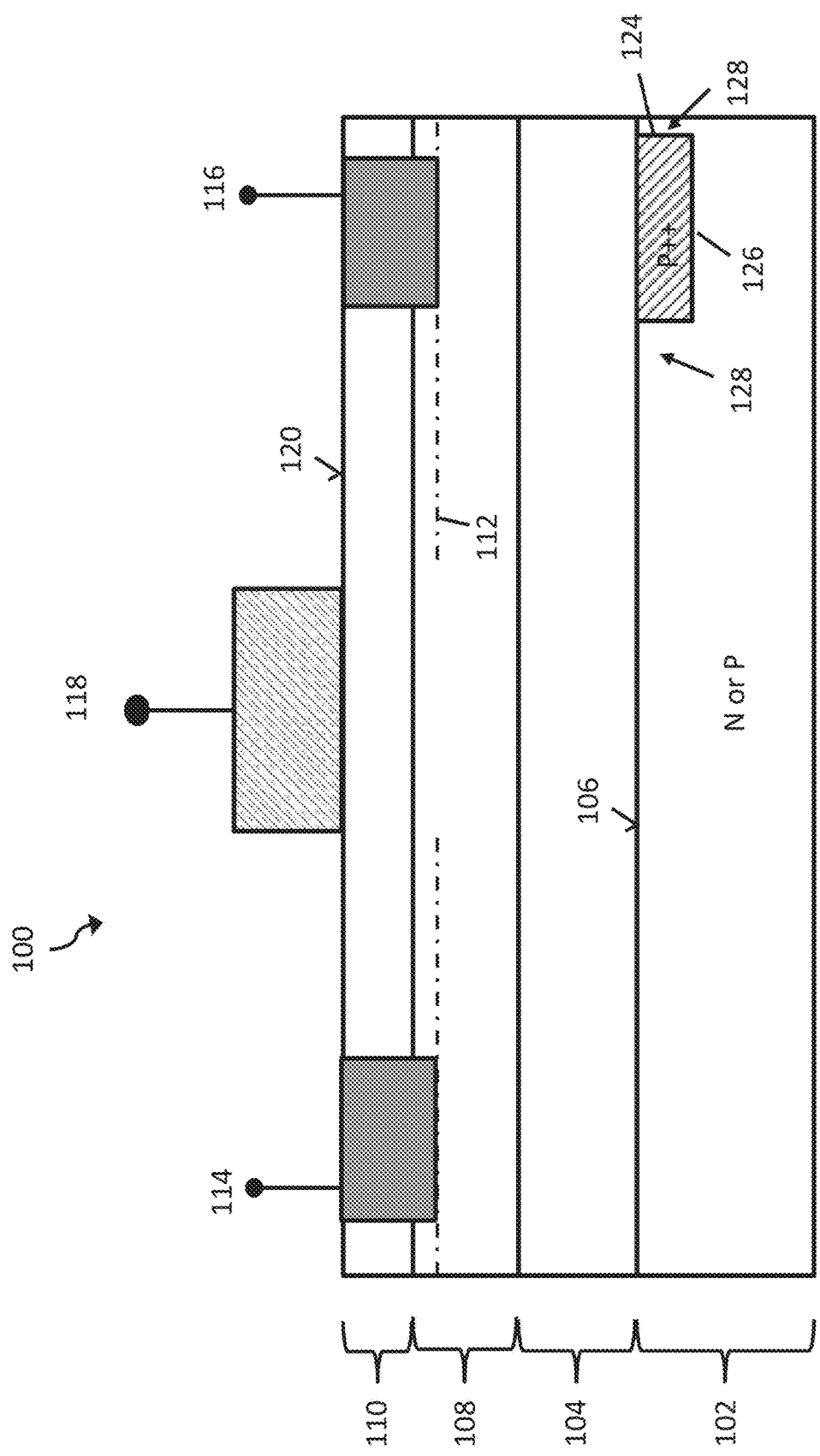
FIG. 2 illustrates a semiconductor device wherein the impact ionization mitigation structure includes a highly-doped island disposed directly beneath the drain terminal of the device at the interface between the base substrate and the III-V semiconductor material, according to an embodiment.

Referring to FIG. 2, the semiconductor device 100 includes a first highly-doped island 126 that is configured as an impact ionization mitigation structure 124, according to an embodiment. The first highly-doped island 126 is disposed directly beneath the second device terminal 116. That is, the second device terminal 116 at least partially overlaps with the first highly-doped island 126 such that a vertical line that is perpendicular to the first surface 106 of the base substrate 102 intersects with both the first highly-doped island 126 and the second device terminal 116. According to an embodiment, the second device terminal 116 completely overlaps with the first highly-doped island 126 such that the first highly-doped island 126 is completely covered by the first device terminal 114. The first highly- doped island 126 extends to the first (upper) surface 106 of the base substrate 102. That is, the first highly-doped island 126 directly adjoins the interface between the base substrate 102 and the immediately adjacent layer formed thereon (i.e., the transition region 104 in the depicted example).

The first highly-doped island 126 provides a high concentration of acceptors to pair with free carriers that are created from impact ionization at high blocking voltages. Exemplary net doping concentrations for the first highly-doped island 126 to achieve this are in the range of $1 \times 10^{19}$-$1 \times 10^{22}$ dopant atoms/cm$^3$. By way of comparison, the immediately adjacent portions of semiconductor material that adjoin the first highly-doped island 126 can have the intrinsic doping concentration of the base substrate 102, which can be in the range of $1 \times 10^{15}$-$1 \times 10^{18}$ dopant atoms/cm$^3$, for example. If the base substrate 102 is a highly-doped substrate, the net doping concentration of the first highly-doped island 126 can be least two orders of magnitude greater than the intrinsic doping concentration of the base substrate 102. For example, in the case that the base substrate 102 has an intrinsic doping concentration of $1 \times 10^{18}$ dopant atoms/cm$^3$, the first highly-doped island 126 can have a doping concentration of at least $1 \times 10^{20}$ dopant atoms/cm$^3$.

As previously mentioned, the base substrate 102 can have either the first conductivity type or the second conductivity type. In either case, the first highly-doped island 126 can have a net conductivity type of the second conductivity type, e.g., P++ net doping. The first highly-doped island 126 can be formed by conventional doping techniques such as masked ion implantation and/or diffusion. According to these techniques, before forming any further layers on the base substrate 102, a mask is formed on the first surface 106 of the base substrate 102 and patterned in a desired geometry of the first highly-doped island 126. Dopant atoms are implanted or diffused into the unmasked portion of the base substrate 102. In the case that the base substrate 102 has a net doping type of the first conductivity type, the doping process compensates for the intrinsic doping of the substrate. In the case that the case that the base substrate 102 has a net doping type of the second conductivity type, the doping process raises the dopant concentration of the base substrate 102 in the first highly-doped island 126. Subsequently, the base substrate 102 can be annealed so as to activate the dopant atoms. As a result, the base substrate 102 includes the first highly-doped island 126 directly beneath the second device terminal 116, wherein the first highly-doped island 126 is laterally adjacent to portions 128 of the base substrate 102 that extend to the first surface 106 and have a lower doping concentration than the first highly-doped island 126.

Figure 3:
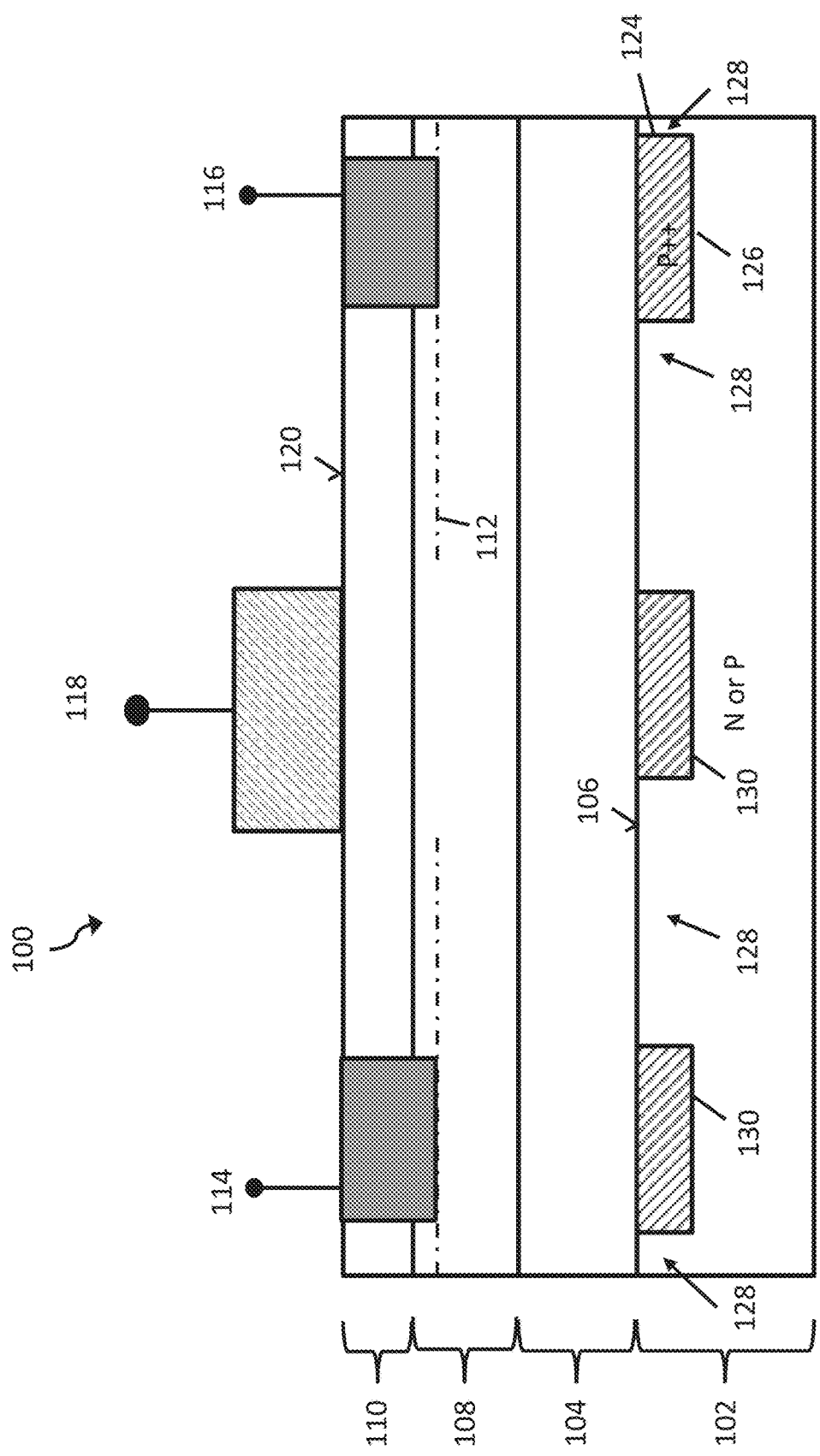
FIG. 3 illustrates a semiconductor device wherein the impact ionization mitigation structure includes a plurality of highly-doped islands with one of the highly-doped islands being disposed directly beneath the drain terminal of the device, according to an embodiment.

Referring to FIG. 3, the semiconductor device 100 includes a plurality of highly-doped islands, according to an embodiment. In this embodiment, the semiconductor device 100 includes the first highly-doped island 126 as previously described with reference to FIG. 2, as well as additional highly-doped islands 130 that are laterally adjacent to the first highly-doped island 126. Each additional highly-doped island 130 is laterally disposed between portions 128 of semiconductor material having a lower net doping concentration than the adjoining highly-doped islands 130. For example, in the depicted embodiment, the semiconductor device 100 includes second and third highly-doped islands 130 that extend to the first surface 106 of the base substrate 102 and are laterally disposed between intrinsically doped portions 128 of the base substrate 102 that extend to the first surface 106 of the base substrate 102. The number of additional highly-doped islands 130 per device may vary, and two is used as merely an example.

Each of the additional highly-doped islands 130 can be formed using the above described masked ion implantation or diffusion technique, for example. One advantage of the embodiment of FIG. 3 in comparison to the embodiment of FIG. 2 is that highly-doped islands 126, 130 can be provided as part of a regular pattern, e.g., with identical width and spacing from one another. Such a configuration is highly controllable and conducive to conventional masking techniques. Moreover, this design is conducive to alignment between the highly-doped islands of the base substrate 102 and the features high-electron-mobility device formed thereon.

Figure 4:
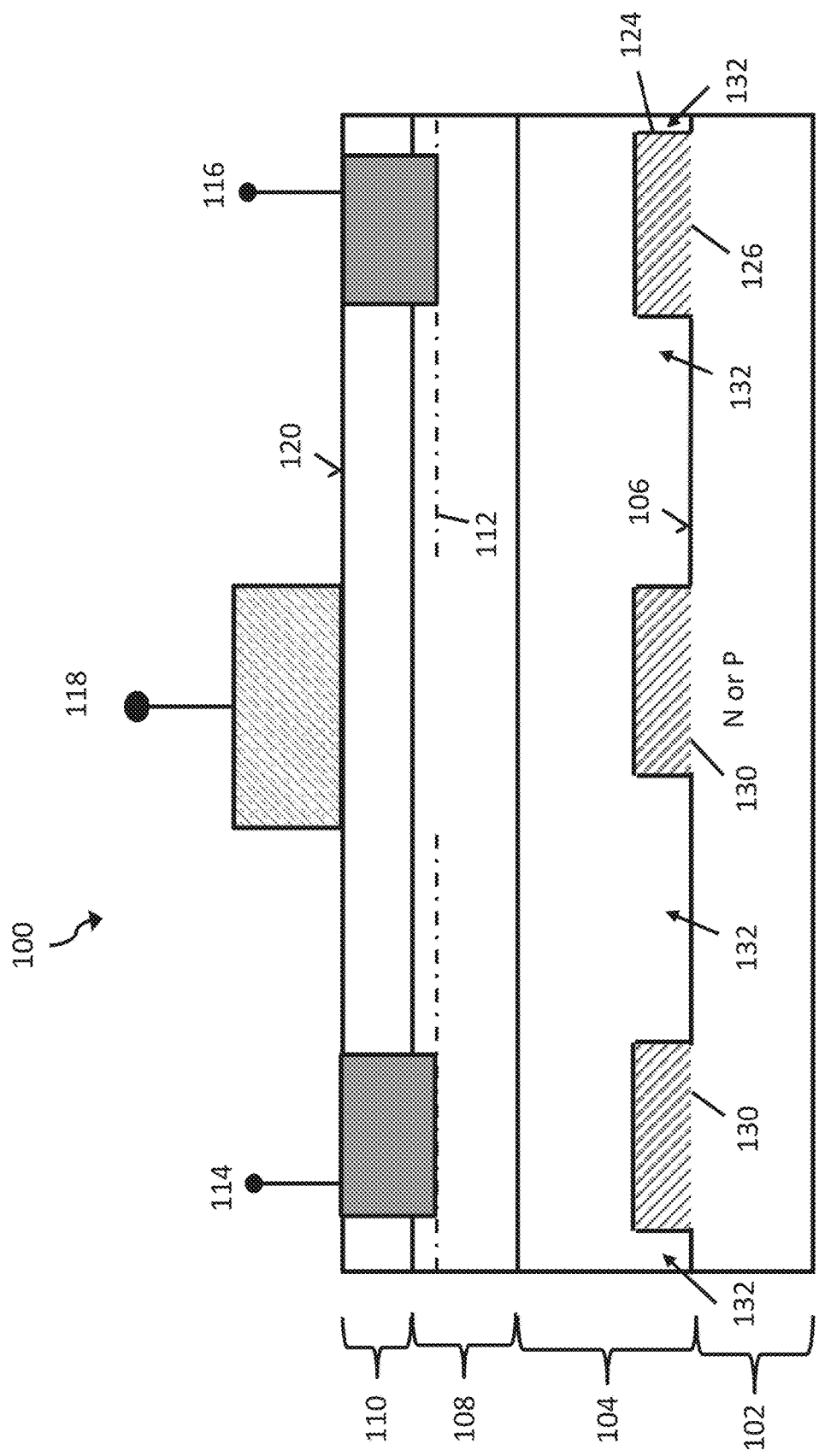
FIG. 4 illustrates a semiconductor device wherein the impact ionization mitigation structure includes a plurality of highly-doped islands with one of the highly-doped islands being disposed directly beneath the drain terminal of the device, according to another embodiment.

Referring to FIG. 4, a semiconductor device 100 with a plurality of highly-doped islands 126, 130 is depicted, according to another embodiment. In this embodiment, the highly-doped islands 126, 130 are laterally disposed between portions 132 of type III-V semiconductor material that are formed on the type IV semiconductor base substrate 102. Different to the embodiment of FIG. 3, the highly-doped islands 126, 130 are elevated relative to the rest of the base substrate 102 and interleaved with recessed portions of the transition region 104.

The device of FIG. 4 can be formed by initially providing an intrinsically doped base substrate 102 with a planar upper surface. Subsequently, a second conductivity type layer with the doping concentration of the highly-doped islands 126, 130 can be formed at the upper surface of the base substrate 102. This may be done by implanting or diffusing second conductivity type dopant atoms into the upper surface of the base substrate 102. Alternatively, a doped epitaxial layer with the doping concentration of the highly-doped islands 126, 13 can be grown on the planar upper surface 106 of the base substrate 102. Subsequently, the base substrate 102 can be etched to form trenches that laterally separate the highly-doped islands 126, 130 from one another. This may be done using a masked etching technique, for example. Subsequently, type III-V semiconductor material (e.g., the transition region 104) is grown on the base substrate 102. The type III-V semiconductor material fills the trenches such that the highly-doped islands 126, 130 are laterally disposed between portions of the type III-V semiconductor material.

Figure 5:
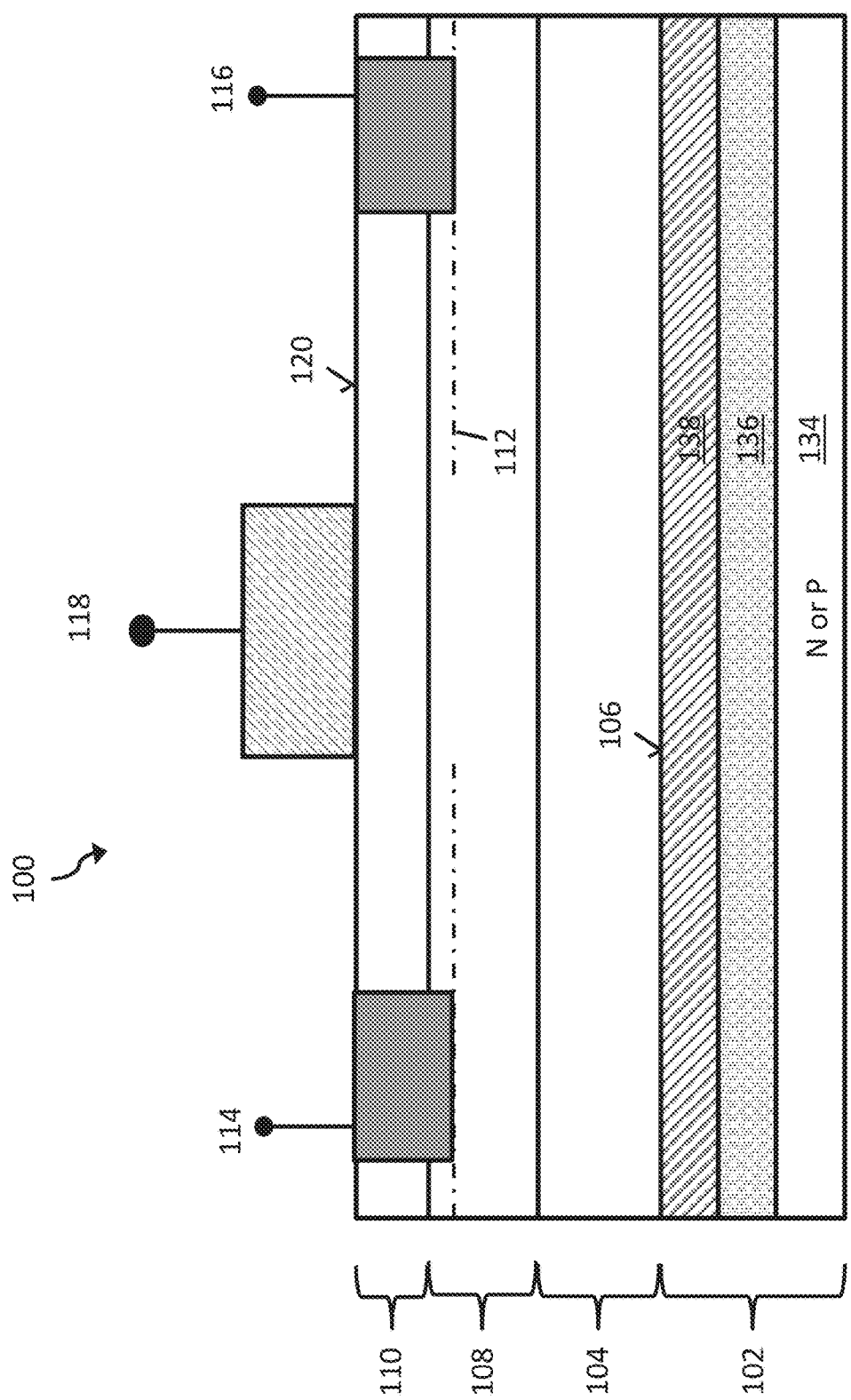
FIG. 5 illustrates a semiconductor device wherein the impact ionization mitigation structure includes a dielectric layer formed directly on a lower region of the base substrate, and a highly-doped layer of type IV semiconductor material formed directly on the dielectric layer, according to an embodiment.

Referring to FIG. 5, a semiconductor device 100 with an impact ionization mitigation structure 124 is depicted, according to another embodiment. In the semiconductor device 100 of FIG. 5, a lower region 134 of the base substrate 102 includes type IV semiconductor material and has the intrinsic doping type and concentration of the base substrate 102 as previously described with reference to FIGS. 2-3.

A dielectric layer 136 (i.e., an electrically insulating layer) is formed directly on the lower region 134 of the base substrate 102. That is, the dielectric layer 136 makes direct contact with the type IV semiconductor material of the lower region 134 of the base substrate 102. Exemplary materials for the dielectric layer 136 include semiconductor nitrides, semiconductor oxides, and semiconductor oxynitrides such as silicon nitride (SiN), silicon dioxide ($SiO_2$), and silicon oxynitride ($SiO_xN_y$). The dielectric layer 136 can be formed by a deposition process, for example.

A highly-doped layer 138 of type IV semiconductor material is formed directly on the dielectric layer 136. That is, the highly-doped layer 138 makes direct contact with the dielectric layer 136. The highly-doped layer 138 can be formed by a deposition technique, for example. The highly-doped layer 138 can be an epitaxially deposited layer of the same type IV semiconductor material as the base substrate 102, e.g., Silicon. Alternatively, the highly-doped layer 138 can be a polycrystalline layer, e.g., polysilicon. In either case, the highly-doped layer 138 has a high concentration of second conductivity type dopants so as to provide a high concentration of acceptor atoms and thus mitigate electron injection into the immediately adjacent type III-V semiconductor material in the manner previously discussed. According to an embodiment, the highly-doped layer 138 has a doping concentration that is at least two orders of magnitude greater than a doping concentration of the lower region 134 of type IV semiconductor material. For instance, a net doping concentration of the lower region 134 can be in the range of $1\times10^{15}$-$1\times10^{16}$ dopant atoms/$cm^3$ whereas the highly-doped layer 138 can have a net doping concentration of at least $10^{18}$ dopant atoms/$cm^3$.

Apart from the configuration of the base substrate 102, the remaining portions of the semiconductor device 100 of Fig. 5 can be identical to the corresponding portions of the semiconductor device 100 described with reference to FIGS. 2-4. That is, the semiconductor device 100 of FIG. 5 can have the transition region 104 of the semiconductor device 100 described with reference to FIGS. 2-4 formed directly on the base substrate 102, followed by the first and second type III-V semiconductor layers 108, 110 as previously described formed thereon. The semiconductor device 100 of FIG. 5 can be configured as a high-electron-mobility-transistor in the manner previously described, wherein the first device terminal 114 is a source terminal, and wherein the second device terminal 116 is a drain terminal. Alternatively, the semiconductor device 100 of FIG. 4 can be configured as a diode in the manner previously described, wherein the first device terminal 114 is an anode, and wherein the second device terminal 116 is a cathode.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device 100 may have AlInN/AlN/GaN barrier/spacer/buffer layer structures.

In general, III-V semiconductor materials, such as GaN, are used to form high electron mobility semiconductor devices according to the embodiments described herein. With GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas such as a 2DEG (two-dimensional electron gas) or 2DHG (two-dimensional hole gas) forms the channel region of the device. A thin, e.g. 1-2 nm, AlN layer can be provided between the GaN buffer layer and the alloy barrier layer to minimize alloy scattering and enhance 2DEG mobility. Other combinations of III-V semiconductor materials can be used in order to form a 2DEG or 2DHG channel region, as is well known in the art. In general, any heterostructure can be used where a band discontinuity is responsible for the device concept. For example, with an AlGaAs system there is no piezoelectric effect, but a confinement concept which involves arranging quantum wells for confinement of the channel region is possible.

The term "in ohmic contact" or "electrically connected" or "in electrical contact" describes a permanent, non-rectifying electrical junction between two conductors that has linear current-voltage (I-V) characteristics, as with Ohm's law. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

The term "lateral" as used in this specification intends to describe an orientation substantially parallel to a first or main surface 120 of a semiconductor substrate or body. This can be for instance the surface of a wafer or a die.

The term "vertical" as used in this specification intends to describe an orientation that is substantially arranged perpendicular to the main surface 120, i.e. parallel to the normal direction of the first surface 120 of the semiconductor substrate or body.

In this specification, n-doped is referred to as first conductivity type while p-doped is referred to as second conductivity type. Alternatively, the semiconductor device can be formed with opposite doping relations so that the first conductivity type can be p-doped and the second conductivity type can be n-doped. Furthermore, some figures illustrate relative doping concentrations by indicating "−" or "+" next to the doping type. For example, "$n^-$" means a doping concentration that is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a base substrate comprising type IV semiconductor material;
    a first semiconductor layer comprising type III-V semiconductor material and formed on a first surface of the base substrate;
    a second semiconductor layer comprising type III-V semiconductor material and formed on the first semiconductor layer, the type III-V semiconductor material of the second semiconductor layer having a bandgap different from a bandgap of the type III-V semiconductor material of the first semiconductor layer such that a two-dimensional charge carrier gas forms at an interface between the first semiconductor layer and the second semiconductor layer;
    a first terminal formed on the second semiconductor layer and being in ohmic contact with the two-dimensional charge carrier gas; and
    a second terminal formed on the second semiconductor layer and being in ohmic contact with the two-dimensional charge carrier gas,
    wherein the base substrate comprises a first highly-doped island that is disposed directly beneath the second terminal and extends to the first surface of the base substrate, and
    wherein the first highly-doped island is laterally disposed between portions of a semiconductor material, the portions of the semiconductor material having a net doping concentration lower than a net doping concentration of the first highly-doped island and being either the type IV semiconductor material from the base substrate or type III-V semiconductor material from a transition layer between the base substrate and the first semiconductor layer,
    wherein the semiconductor device is configured to block a conductive connection between the first terminal and the second terminal during a blocking state,
    wherein the semiconductor device is configured such that a depletion region extends from the second terminal and into the base substrate during the blocking state.

2. The semiconductor device of claim 1, wherein the portions of the semiconductor material are portions of the base substrate that extend to the first surface, and
    wherein the net doping concentration of the portions of the semiconductor material is an intrinsic doping concentration of the base substrate.

3. The semiconductor device of claim 2, wherein the intrinsic doping concentration of the base substrate is in a range of $1\times10^{15}$ dopant atoms/cm$^3$ -$1\times10^{19}$ dopant atoms/cm$^3$, wherein the net doping concentration of the first highly-doped island is in a range of $1\times10^{19}$ dopant atoms/cm$^3$ -$1\times10^{22}$ dopant atoms/cm$^3$, and wherein the net doping concentration of the first highly-doped island is at least two orders of magnitude greater than the intrinsic doping concentration of the base substrate.

4. The semiconductor device of claim 2, wherein the intrinsic doping concentration of the base substrate is at least $1\times10^{18}$ dopant atoms/cm$^3$, and
    wherein the net doping concentration of the first highly-doped island is at least two orders of magnitude greater than the intrinsic doping concentration of the base substrate.

5. The semiconductor device of claim 1, wherein an intrinsic conductivity type of the base substrate is a first conductivity type, and wherein the first highly-doped island has a net conductivity type of a second conductivity type that is opposite from the first conductivity type.

6. The semiconductor device of claim 1, wherein an intrinsic conductivity type of the base substrate is a first conductivity type, and wherein the first highly-doped island has a net conductivity type of the first conductivity type.

7. The semiconductor device of claim 1, wherein the first highly-doped island is laterally disposed between portions of the transition layer.

8. The semiconductor device of claim 1, wherein the semiconductor device is a high-electron-mobility-transistor, wherein the first terminal is a source terminal, and wherein the second terminal is a drain terminal.

9. The semiconductor device of claim 1, wherein the semiconductor device is configured as a diode, wherein the first terminal is an anode, and wherein the second terminal is a cathode.

10. The semiconductor device of claim 1, wherein the base substrate further comprises second and third highly-doped islands that are laterally disposed between additional portions of the semiconductor material, the additional portions of the semiconductor material each having a net doping concentration lower than a net doping concentration of each of the second and third highly-doped islands.

11. The semiconductor device of claim 1, wherein the base substrate is a silicon substrate, wherein the first semiconductor layer is a layer of gallium nitride, and wherein the second semiconductor layer is a layer of aluminum gallium nitride.

12. The semiconductor device of claim 1, wherein an underside of the second terminal faces the base substrate and is in ohmic contact with the two-dimensional charge carrier gas, and wherein the first highly-doped island is disposed directly beneath the underside of the second terminal.

13. The semiconductor device of claim 1, wherein the second terminal is isolated from the base substrate.

14. A semiconductor device, comprising:
    a base substrate comprising a type IV semiconductor material and a highly-doped island that extends to a first surface of the base substrate and is laterally disposed between portions of a semiconductor material, the portions of the semiconductor material having a net doping concentration lower than a net doping concentration of the first highly-doped island and being either type IV semiconductor material from the base substrate or type III-V semiconductor material from a transition layer formed on the base substrate;
    a first semiconductor layer comprising III-V semiconductor material and disposed on the transition layer;
    a second semiconductor layer comprising type III-V semiconductor material and formed on the first semiconductor layer, the type III-V semiconductor material of the second semiconductor layer having a bandgap different from a bandgap of the type III-V semiconductor material of the first semiconductor layer such that a two-dimensional charge carrier gas forms at an interface between the first semiconductor layer and the second semiconductor layer;
a first terminal formed on the second semiconductor layer and being in ohmic contact with the two-dimensional charge carrier gas; and
a second terminal formed on the second semiconductor layer and being in ohmic contact with the two-dimensional charge carrier gas,
wherein the semiconductor device is configured to block a conductive connection between the first terminal and the second terminal during a blocking state,
wherein a depletion region extending from the second terminal and into the base substrate forms across the highly-doped island during the blocking state, and
wherein the highly-doped island is configured to suppress electron generation in the depletion region via impact ionization during the blocking state.

15. The semiconductor device of claim 14, wherein the semiconductor device is a high-electron-mobility-transistor, wherein the first terminal is a source terminal, wherein the second terminal is a drain terminal, and wherein the highly-doped island is disposed directly beneath the drain terminal.

16. The semiconductor device of claim 14, wherein the semiconductor device is a diode, wherein the first terminal is an anode terminal, wherein the second terminal is a cathode terminal, and wherein the highly-doped island is disposed directly beneath the cathode terminal.

* * * * *

UNITED STATES PATENT AND TRADEMARK OFFICE
CERTIFICATE OF CORRECTION

| | |
|---|---|
| PATENT NO. | : 11,588,024 B2 |
| APPLICATION NO. | : 15/462019 |
| DATED | : February 21, 2023 |
| INVENTOR(S) | : S. Yang et al. |

It is certified that error appears in the above-identified patent and that said Letters Patent is hereby corrected as shown below:

In the Claims

Column 11, Line 45 (Claim 1, Line 33) please change "layer between" to -- layer formed between --

Signed and Sealed this
Ninth Day of May, 2023

Katherine Kelly Vidal
*Director of the United States Patent and Trademark Office*